US007615482B2

(12) United States Patent
Edelstein et al.

(10) Patent No.: US 7,615,482 B2
(45) Date of Patent: Nov. 10, 2009

(54) STRUCTURE AND METHOD FOR POROUS SICOH DIELECTRIC LAYERS AND ADHESION PROMOTING OR ETCH STOP LAYERS HAVING INCREASED INTERFACIAL AND MECHANICAL STRENGTH

(75) Inventors: Daniel C. Edelstein, White Plains, NY (US); Alexandros Demos, Dublin, CA (US); Stephen M. Gates, Ossining, NY (US); Alfred Grill, White Plains, NY (US); Steven E. Molis, Patterson, NY (US); Vu Ngoc Tran Nguyen, San Jose, CA (US); Steven Reiter, Santa Clara, CA (US); Darryl D. Restaino, Modena, NY (US); Kang Sub Yim, Santa Clara, CA (US)

(73) Assignees: International Business Machines Corporation, Armonk, NY (US); Applied Materials, Inc., Santa Clara, CA (US)

( * ) Notice: Subject to any disclaimer, the term of this patent is extended or adjusted under 35 U.S.C. 154(b) by 262 days.

(21) Appl. No.: 11/690,248

(22) Filed: Mar. 23, 2007

(65) Prior Publication Data
US 2008/0233366 A1 Sep. 25, 2008

(51) Int. Cl.
*H01L 21/4763* (2006.01)
(52) U.S. Cl. ............... 438/627; 257/751; 257/E23.141; 257/E21.495; 257/E21.023; 257/E21.246; 257/E21.486; 257/701; 257/704; 257/707; 216/41; 216/42; 216/49; 438/736; 428/201
(58) Field of Classification Search .................. 438/627, 438/736; 257/751, E23.141, E21.495, 701, 257/704, 707, E21.023, E21.246, E21.486; 216/41–42, 49; 428/201
See application file for complete search history.

(56) References Cited

U.S. PATENT DOCUMENTS

| 6,147,009 | A | 11/2000 | Grill et al. |
| 6,252,295 | B1 | 6/2001 | Cote et al. |
| 6,312,793 | B1 | 11/2001 | Grill et al. |
| 6,437,443 | B1 | 8/2002 | Grill et al. |
| 6,441,491 | B1 | 8/2002 | Grill et al. |
| 6,479,110 | B2 | 11/2002 | Grill et al. |
| 6,497,963 | B1 | 12/2002 | Grill et al. |
| 6,541,398 | B2 | 4/2003 | Grill et al. |
| 6,570,256 | B2 | 5/2003 | Conti et al. |
| 6,740,539 | B2 | 5/2004 | Conti et al. |
| 7,067,437 | B2 | 6/2006 | Edelstein et al. |
| 7,335,980 | B2 * | 2/2008 | Nguyen et al. ............. 257/701 |
| 2003/0114013 | A1 * | 6/2003 | Hedrick et al. ............. 438/734 |
| 2005/0194619 | A1 * | 9/2005 | Edelstein et al. ........... 257/232 |
| 2006/0003572 | A1 * | 1/2006 | Chen et al. ................. 438/622 |
| 2006/0091559 | A1 | 5/2006 | Nguyen et al. |

* cited by examiner

*Primary Examiner*—Thanh V. Pham
*Assistant Examiner*—Mohammad T Karimy
(74) *Attorney, Agent, or Firm*—Lisa U. Jaklitsch

(57) ABSTRACT

Disclosed is a structure and method for forming a structure including a SiCOH layer having increased mechanical strength. The structure includes a substrate having a layer of dielectric or conductive material, a layer of oxide on the layer of dielectric or conductive material, the oxide layer having essentially no carbon, a graded transition layer on the oxide layer, the graded transition layer having essentially no carbon at the interface with the oxide layer and gradually increasing carbon towards a porous SiCOH layer, and a porous SiCOH (pSiCOH) layer on the graded transition layer, the porous pSiCOH layer having an homogeneous composition throughout the layer. The method includes a process wherein in the graded transition layer, there are no peaks in the carbon concentration and no dips in the oxygen concentration.

21 Claims, 5 Drawing Sheets

STRUCTURE AND METHOD FOR POROUS SICOH DIELECTRIC LAYERS AND ADHESION PROMOTING OR ETCH STOP LAYERS HAVING INCREASED INTERFACIAL AND MECHANICAL STRENGTH

BACKGROUND OF THE INVENTION

The present invention generally relates to a semiconductor electronic device structure comprising at least one porous SiCOH (pSiCOH, carbon-doped oxide) layer having improved interfacial strength (adhesive and cohesive strength near the interface) to a dielectric or conducting layer. The improved interfacial strength is caused by the presence of transition layers that are formed between the porous SiCOH layer and the dielectric or conducting layer. The transition layers are formed in the present invention by starting the deposition of a specific layer, while a surface preparation plasma is still present and active in the reactor.

The continuous shrinking in dimensions of electronic devices utilized in ULSI circuits in recent years has resulted in increasing the resistance of the BEOL metallization without concomitantly decreasing the interconnect capacitances. Often interconnects are even scaled to higher aspect ratios to mitigate the resistance increases, leading to increased capacitances. This combined effect increases signal delays in ULSI electronic devices. In order to improve the switching performance of future ULSI circuits, low dielectric constant (k) insulators and particularly those with k significantly lower than silicon oxide are being introduced to reduce the capacitance.

The low-k materials that have been considered for applications in ULSI devices include polymers containing Si, C and O, such as methylsiloxane, methylsilsesquioxanes, and other organic and inorganic polymers which are fabricated by spin-on techniques or, Si, C, O and H containing materials (SiCOH, SiOCH, carbon-doped oxides (CDO), silicon-oxy-carbides, organosilicate glasses (OSG)) deposited by plasma enhanced chemical vapor deposition (PECVD) techniques. In an effort to decrease the dielectric constant further, Grill et al. U.S. Pat. No. 6,312,793, the disclosure of which is incorporated by reference herein, discloses porous low-k dielectrics such as porous SiCOH. The incorporation of the low-k dielectrics in the interconnect structures of integrated circuits (IC) often requires the use of other dielectric materials as diffusion barrier caps or etch-stop and chemo-mechanical polishing (CMP) hardmasks. The adhesion among the different layers in the complex structures of an IC device is often too low, resulting in delaminations during the processing of the device, dicing into chips, or reduced reliability in response to mechanical stresses imposed by typical chip packaging materials. Often even when the adhesion is adequate, the deposited low-k film may possess degraded cohesive strength near the initial interface that is formed during deposition, and adhesion testing leads to fracture within this initial layer, which may be from single to tens of nm thick. Without careful failure analysis, the low failure energies from adhesion testing of such cases may be mistakenly attributed to poor interfacial adhesion, rather than substandard cohesive strength of the near-interface low-k film. This is especially true for interfacial strength (adhesive and cohesive strength near the interface) of a carbon doped oxide dielectric comprised of Si, C, O and H (SiCOH) to other hardmask or diffusion barrier cap dialectics, such as SiN, SiC(H) or SiCN(H).

It would thus be highly desirable to provide a semiconductor device comprising an insulating structure including a multitude of dielectric and conductive layers with good interfacial strength among the different layers, and a method for manufacturing such semiconductor devices.

Various solutions have been proposed for increasing the interfacial strength of low-k dielectrics to the previous layer.

Conti et al. U.S. Pat. Nos. 6,570,256 and 6,740,539, the disclosures of which are incorporated by reference herein, disclose a carbon-graded layer which can be employed within the initial region of a carbon-containing organosilicate layer to improve adhesion to the underlying substrate. However, the so-called carbon-graded layer consists of successive distinct layers with the concentration of carbon increasing in steps from layer to layer. Thus, each carbon-graded layer is in actuality a layer of constant carbon concentration.

Edelstein et al. U.S. Pat. No. 7,067,437, the disclosure of which is incorporated by reference herein, discloses a carbon-graded transition layer between the underlying dielectric or conducting layer and the dense SiCOH layer. The carbon-graded transition layer may be oxygen rich and/or carbon depleted.

The foregoing references developed structures containing dense dielectric layers. The present inventors have found that porous dielectric layers present certain difficulties in their formation, particularly due to the carbon generated by the porogen used to form the pores in the dielectric. Another difficulty arises when the precursors used to form porous dielectric layers react rapidly in the gas phase, forming particulates which settle on the manufacturing substrate, an occurrence known as gas phase nucleation (GPN). Particles then cause patterning defects and other manufacturing failures. The present inventors have analyzed those methods (conditions) that produce GPN and the preferred methods (conditions) that do not produce GPN.

Accordingly, it is a purpose of the present invention to provide a semiconductor device structure and method for manufacturing an insulating structure comprising a multitude of dielectric and conductive layers with improved interfacial strengths between at least one porous SiCOH layer and other layers in the interconnect structure.

It is another purpose of the present invention to achieve these improved interfacial strengths by a process which would allow continuous grading of the interfaces.

Further purposes and advantages of the present invention will become apparent after referring to the following description of the invention considered in conjunction with the accompanying drawings.

BRIEF SUMMARY OF THE INVENTION

The purposes and advantages of the invention have been achieved by providing, according to a first aspect of the invention, a method for improving the interfacial strength between different layers, the method comprising the steps of:

a) providing a substrate having a layer of dielectric or conductive material;

b) forming a layer of oxide on the layer of dielectric or conductive material, the oxide layer having essentially no carbon;

c) forming a graded transition layer on the oxide layer, the graded transition layer having essentially no carbon at the interface with the oxide layer and gradually increasing carbon and towards a porous SiCOH layer; and d) forming a porous SiCOH layer on the graded transition layer, the porous SiCOH layer having an homogenous uniform composition throughout the layer.

According to a second aspect of the invention, there is provided a method for improving the interfacial strength between different layers, the method comprising the steps of:

a) providing a substrate having a layer of dielectric or conductive material;

b) introducing a flow of oxygen and SiCOH precursor into a chamber for a first time period so as to form a layer of oxide on the layer of dielectric or conductive material, the oxide layer having essentially no carbon;

c) maintaining the flow of oxygen while gradually increasing the flow of the SiCOH precursor to a predetermined amount while also introducing and gradually increasing the flow of a porogen precursor to a predetermined amount into the chamber for a second time period so as to form a graded transition layer on the oxide layer, the graded transition layer having essentially no carbon at the interface with the oxide layer and gradually increasing carbon a porous SiCOH layer; and d) maintaining the flow of SiCOH precursor and porogen precursor at the predetermined amount in the chamber for a third time period while abruptly reducing the flow of oxygen to a predetermined value so as to form a porous SiCOH layer on the graded transition layer, the porous SiCOH layer having an homogenous composition throughout the layer.

According to a third aspect of the invention, there is provided a method for improving the interfacial strength between different layers, the method comprising the steps of:

a) providing a substrate having a layer of dielectric or conductive material;

b) introducing a flow of oxygen and a flow of SiCOH precursor into a chamber for a first time period so as to form a layer of oxide on the layer of dielectric or conductive material, the oxide layer having essentially no carbon, the flows of oxygen and SiCOH precursor being independently adjustable as to start time, end time and ramp rate during the first time period;

c) maintaining the flow of oxygen while gradually increasing the flow of the SiCOH precursor to a predetermined amount while also introducing and gradually increasing the flow of a porogen precursor to a predetermined amount into the chamber for a second time period so as to form a graded transition layer on the oxide layer, the graded transition layer having essentially no carbon at the interface with the oxide layer and gradually increasing carbon towards a porous SiCOH layer, wherein the flows of oxygen, SiCOH precursor and porogen precursor being independently adjustable as to start time, end time and ramp rate during the second time period; and d) maintaining the flow of SiCOH precursor and porogen precursor at the predetermined amount in the chamber for a third time period while abruptly reducing the flow of oxygen to a predetermined value so as to form a porous SiCOH layer on the graded transition layer, the porous SiCOH layer having an homogeneous composition throughout the layer, wherein the flows of oxygen, SiCOH precursor and porogen precursor being independently adjustable as to start time, end time and ramp rate during the third time period.

According to a fourth aspect of the invention, there is provided a SiCOH film structure comprising:

a substrate having a layer of dielectric or conductive material;

a layer of oxide on the layer of dielectric or conductive material, the oxide layer having essentially no carbon;

a graded transition layer on the oxide layer, the graded transition layer having essentially no carbon at the interface with the oxide layer and gradually increasing carbon towards a porous SiCOH layer; and a porous SiCOH (pSiCOH) layer on the graded transition layer, the porous pSiCOH layer having an homogeneous composition throughout the layer.

According to a fifth aspect of the invention, there is provided an electronic structure comprising:

a substrate having a layer of dielectric material;

a plurality of copper damascene conductors within said layer of dielectric material, wherein said dielectric material includes:

a layer of oxide on the layer of dielectric material, the oxide layer having essentially no carbon;

a graded transition layer on the oxide layer, the graded transition layer having essentially no carbon at the interface with the oxide layer and gradually increasing carbon towards a porous SiCOH layer; and a porous SiCOH (pSiCOH) layer on the graded transition layer, the porous pSiCOH layer having an homogeneous composition throughout the layer.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The present invention discloses a structure with improved interfacial strength between different layers of insulating or conductive materials. The improved interfacial strength is obtained in the present invention by forming thin transition layers between the different pairs of layers. The transition layer is formed while the plasma of a surface pretreatment step is still present and active in the reactor chamber at the same time the precursors of the film that is being deposited are introduced into the reactor chamber.

Figure 1:
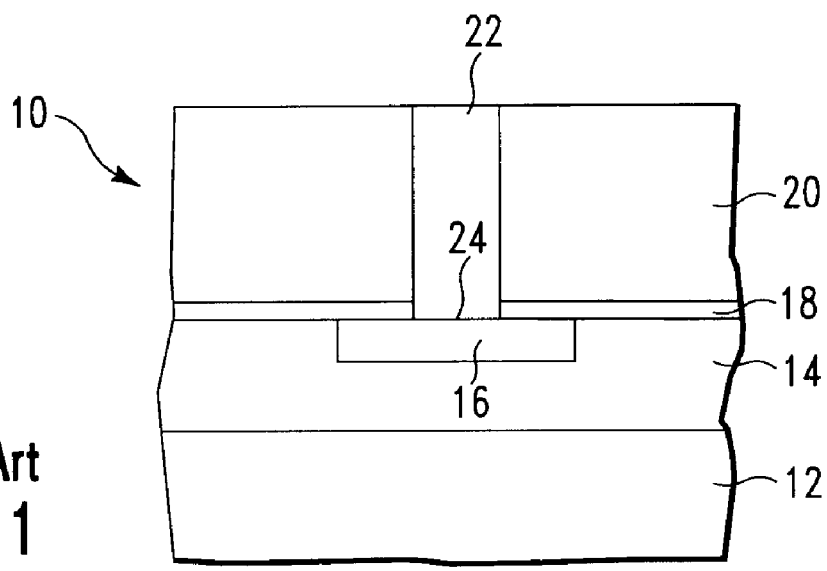
FIG. 1 is a cross sectional view of a prior art interconnect substrate.

Referring to the Figures in more detail, and particularly referring to FIG. 1, there is shown a prior art semiconductor structure, generally indicated by 10. Semiconductor structure 10 comprises the underlying semiconductor material 12 having one or more metallization layers comprising dielectric material 14 and metallization 16. It should be understood that there could be one or more metallization layers between dielectric material 14 and semiconductor material 12.

On top of dielectric material 14 is another layer of dielectric material 20 representing the next metallization layer. There could be further metallization layers on top of dielectric material 20 until the required number of metallization layers are fabricated. Such further metallization layers are not shown for purposes of clarity and are not necessary to the understanding of the present invention. Between dielectric material 20 and dielectric material 14 is a capping layer 18. The capping layer 18 is typically used when the dielectric materials 14, 20 are so-called low-k dielectric materials. Capping layer 18 is opened at 24 during the processing of semiconductor structure 10 to permit electrical connection between metallization 16 and via 22. Capping layer 18 is typically a silicon carbide based material such as SiCH or SiCHN.

Modern day semiconductor structures often mix and match dielectric materials so as to obtain the maximum in performance and reliability. As noted above, low-k dielectric materials are preferred because of their lower dielectric constant which enhances the electrical performance of the interconnect structure. Dielectric material 14 may be any commonly used low-k dielectric material as referenced previously. Dielectric material 20, however, is a SiCOH dielectric material. It has been found that there is poor adhesion between SiCOH and the material of the capping layer 18, often resulting in delamination of the metallization layer.

The adhesion problems found between SiCOH (so-called dense SiCOH) and the underlying capping layer 18 are exacerbated when the dielectric material 20 is a porous SiCOH (pSiCOH). Porous SiCOH is preferred because of its lower dielectric constant and is being integrated into state of the art semiconductor structures. The present inventors have found, however, that porous SiCOH presents certain difficulties in its formation due to the interaction of two precursors and O2 (oxygen) used to form porous dielectric layers in the processing reactor. Under some conditions, the precursors react rapidly in the gas phase forming particulates on the manufacturing substrate, an occurrence known as gas phase nucleation (GPN).

Figure 2:
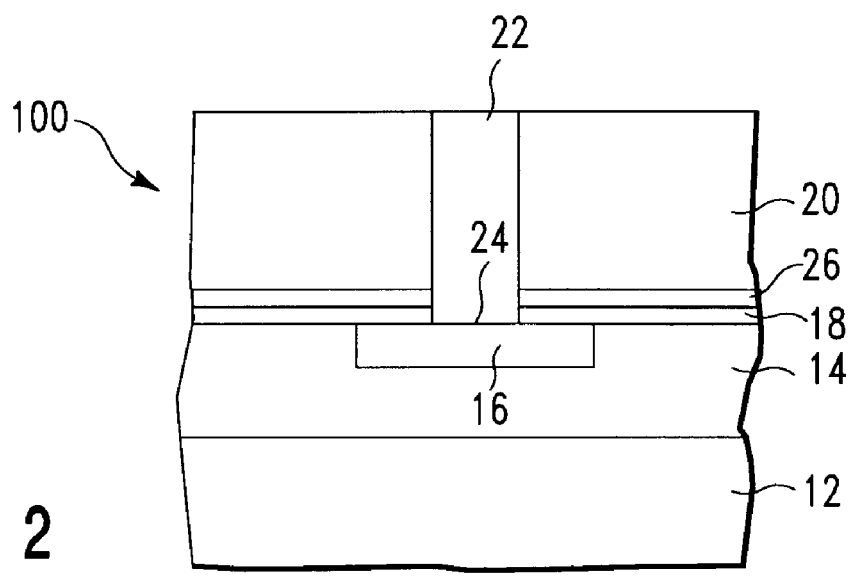
FIG. 2 is a cross sectional view of an interconnect substrate according to the present invention in which there is an interfacial layer to improve a SiCOH dielectric layer to the preceding layer.

Turning now to FIG. 2, there is shown a preferred embodiment of the present invention. Semiconductor structure 100 includes semiconductor material 12 and multiple metallization layers, one of which is indicated by dielectric material 14 having metallization 16. Dielectric material 14 may be any low-k dielectric material including porous SiCOH. On top of dielectric material 14 is capping layer 18 which again has been opened at 24 to allow connection to via 22 (such as a copper damascene connector or other metallization) in dielectric material 20. In practice, the typical semiconductor structure 100 will have many such vias 22. Dielectric material 20 is a porous pSiCOH. To improve the interfacial strength between porous SiCOH 20 and capping layer 18, there is an interfacial structure 26 which dramatically, surprisingly and unexpectedly improves the interfacial strength between the porous SiCOH 20 and capping layer 18.

Figure 3:
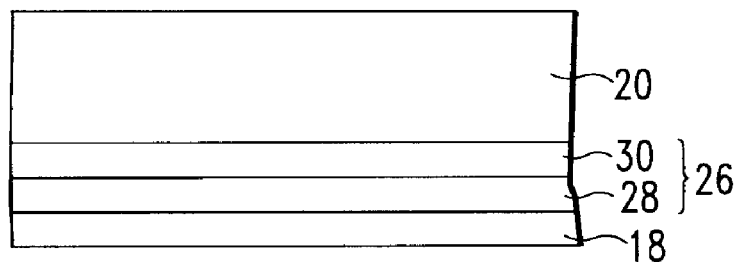
FIG. 3 is an enlarged cross sectional view of the interfacial layer and SiCOH layer.

Interfacial structure 26 is shown in greater detail in FIG. 3 where it can be seen that interfacial structure 26 is actually made up of two separate layers 28 and 30. Layer 28 is an oxide layer having essentially no carbon. What is meant by "essentially no carbon" is that no detectible carbon is measured in the layer, measured for example by x-ray photoelectron spectroscopy (XPS) or time-of-flight secondary ion mass spectrometry (TOF SIMS). While having no carbon present is preferred for purposes of the present invention, it is believed that carbon in amounts up to 0.1 to 3 atomic percent may not adversely affect the present invention. Layer 30 is a graded transition layer which has essentially no carbon and no porosity at the interface with oxide layer 28 and gradually increases both the amount of carbon and porosity until predetermined levels are reached. At that point, an homogeneous porous SiCOH layer 20 is formed on the graded transition layer 30.

It is desirable to keep layers 28 and 30 as thin as possible because they increase the dielectric constant of the integrated structure. It is preferred that oxide layer be about 1 to 100 Angstroms in thickness (20 Angstroms being highly preferred) while the graded transition layer be about 50 to 300 Angstroms in thickness.

It is desirable that the concentration profile of the carbon in graded transition layer 30 experience no spikes or peaks (hereafter collectively referred to as peaks) and that the oxygen concentration in graded transition layer 30 experience no dips or valleys as either of these conditions can lead to a weakness in the transition layer 30. The present inventors have found that such weakness can lead to delamination of porous SiCOH within interfacial structure 26, and have found that depth profiling with TOF SIMS is a preferred method to detect the carbon and oxygen concentration profile.

The inventors believe that there are three conditions which are important to the formation of a robust interfacial layer 26. There must be essentially no carbon in oxide layer 28, the concentration of the carbon in graded transition layer 30 must have no peaks and the oxygen concentration in graded transition layer 30 must have no dips or valleys.

Figure 4:
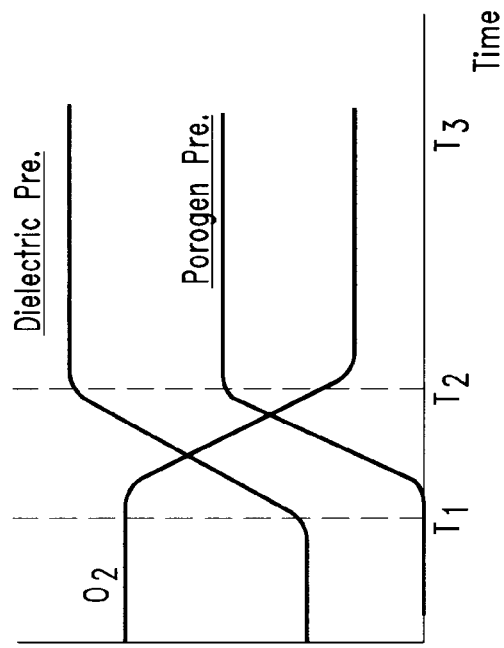
FIG. 4 is a graph of flow rate versus time for the formation of a dense SiCOH layer.

Referring now to FIG. 4, there is shown a diagram of flow rate versus time for a prior art process. The dielectric precursor (a SiCOH precursor) is flown into a plasma enhanced chemical vapor deposition (PECVD) chamber for a time T1, usually 1-2 seconds. Thereafter, the dielectric precursor is ramped up while the oxygen concentration is ramped down for a time T2, usually 2 seconds. For a time T3, usually 50 seconds, the dielectric precursor is held at a high flow rate while the oxygen is held at a low flow rate. The resultant structure is a carbon graded transition layer formed during the T1-T2 interval in which carbon gradually increases while the formation of the SiCOH gradually increases as well followed by a dense homogenous layer of dielectric SiCOH in the T2-T3 interval.

Figure 5:
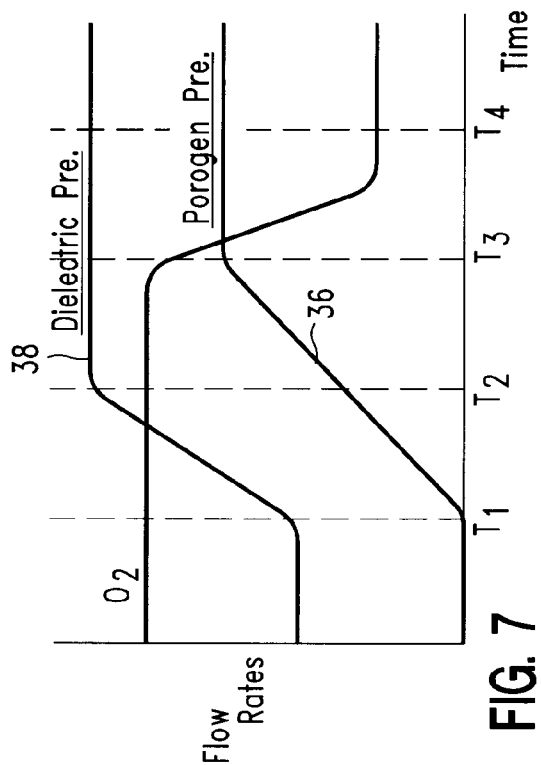
FIG. 5 is a graph of flow rate versus time for the formation of a porous SiCOH layer.

Referring to FIGS. 4 to 7 the actual precursors flows have rounded, gradual, transitions as is known in the art while the Figures schematically show discrete, sharp transitions. As noted above, it is currently desired to form at least one layer of porous SiCOH. A person skilled in the art might assume that the porogen precursor should be introduced when the dielectric precursor is ramped up as shown in FIG. 5. The present inventors, however, have found that such a process sequence results in a large carbon peak in the carbon graded transition layer formed during the T1-T2 interval, eventually resulting in a mechanically weak interfacial layer.

Figure 6:
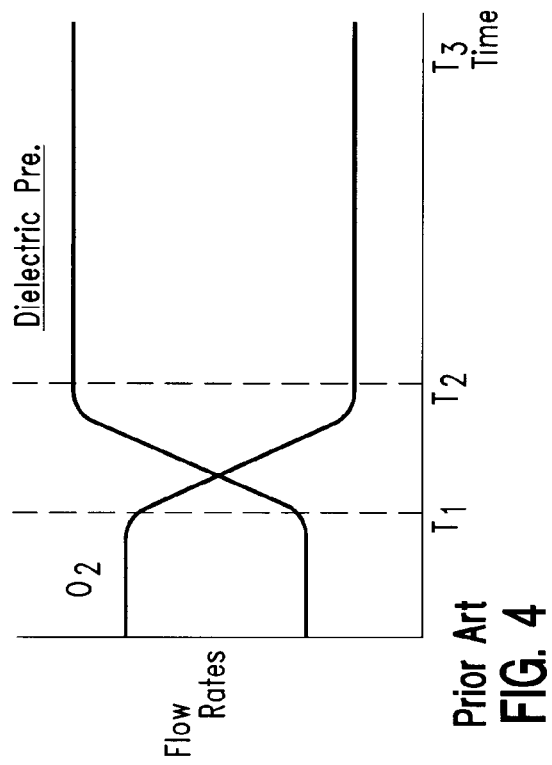
FIG. 6 is a graph of flow rate versus time for the formation of a porous SiCOH layer according to the first embodiment of the present invention.

According to a first embodiment of this invention, the porogen precursor is introduced later in the process flow, such as during the T2-T3 interval, as shown in FIG. 6. The time difference from T1 to T2 is called an "offset" for porogen introduction, and the offset improves the process but still results in a carbon peak and an oxygen dip, both of which lead to a mechanically weak interfacial layer.

Figure 7:
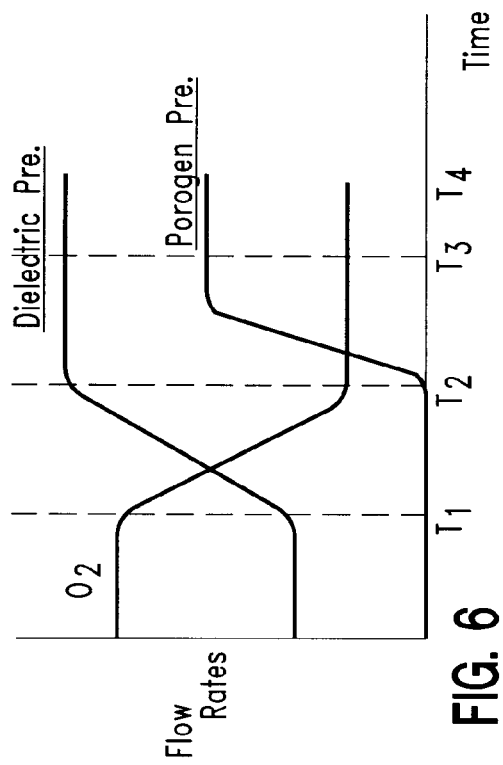
FIG. 7 is a graph of flow rate versus time for the formation of a porous SiCOH layer according to the present invention according to the second embodiment of the present invention.

The process according to the second embodiment of the present invention is illustrated in FIG. 7. Oxygen and the dielectric precursor are flown into a PECVD chamber for a time T1, usually 1-4 seconds. Helium or argon may be optionally introduced into the reactor chamber with the oxygen. The oxygen flow rate is kept high while the dielectric precursor flow rate is kept low so that an oxide layer having essentially no carbon (as defined above) is formed on the substrate. During a time T2, usually 2-4 seconds, the dielectric precursor is ramped up to a predetermined level while the oxygen flow rate is kept high. T2 is the time at which the dielectric precursor flow is stable. The porogen precursor is introduced during the T1-T2 interval. T3 is the time at which the porogen precursor flow is stable. Two methods may be used to have T3>T2. Either an offset or delay by 1-2 seconds is used as was shown in FIG. 6, or the ramp rate of the porogen may be lower than that of the dielectric. This case is shown as 36 in FIG. 7 with a lower slope for the porogen versus the dielectric. During the T1-T2 interval, a carbon graded transition layer is formed in which both carbon and porosity gradually and uniformly increase. There are no carbon peaks or oxygen dips formed during T2. It is preferred that the interval 38 between T2 and T3 be as short as possible. The present inventors have found that it is preferred to ramp down oxygen flow at T3 and not earlier in the process. Ramping down oxygen early in the process was shown with respect to FIGS. 5 and 6, and this leads to a carbon peak and/or oxygen dip and resulting weaker adhesion strength. Further, an objective during the T1-T2 interval is to form SiCOH first so the oxygen is kept high during the T1-T2 interval. At the beginning of T3, or possibly just before the beginning of T3, the oxygen flow rate is ramped steeply down while the dielectric precursor and porogen precursor are held approximately constant until the process terminates. The time T4 is when all flows are stabilized at values to deposit the porous SiCOH film. The T4 time period is typically in the range of 10 to 200 seconds. During T4, an homogenous porous SiCOH layer is formed. The various flows of oxygen, dielectric precursor and porogen may be independently adjusted so as to obtain the best dielectric layer. Each of the foregoing stages are performed without interruption of the plasma in the reactor but by adjusting the gas mixtures and plasma parameters at each stage.

Figure 8:
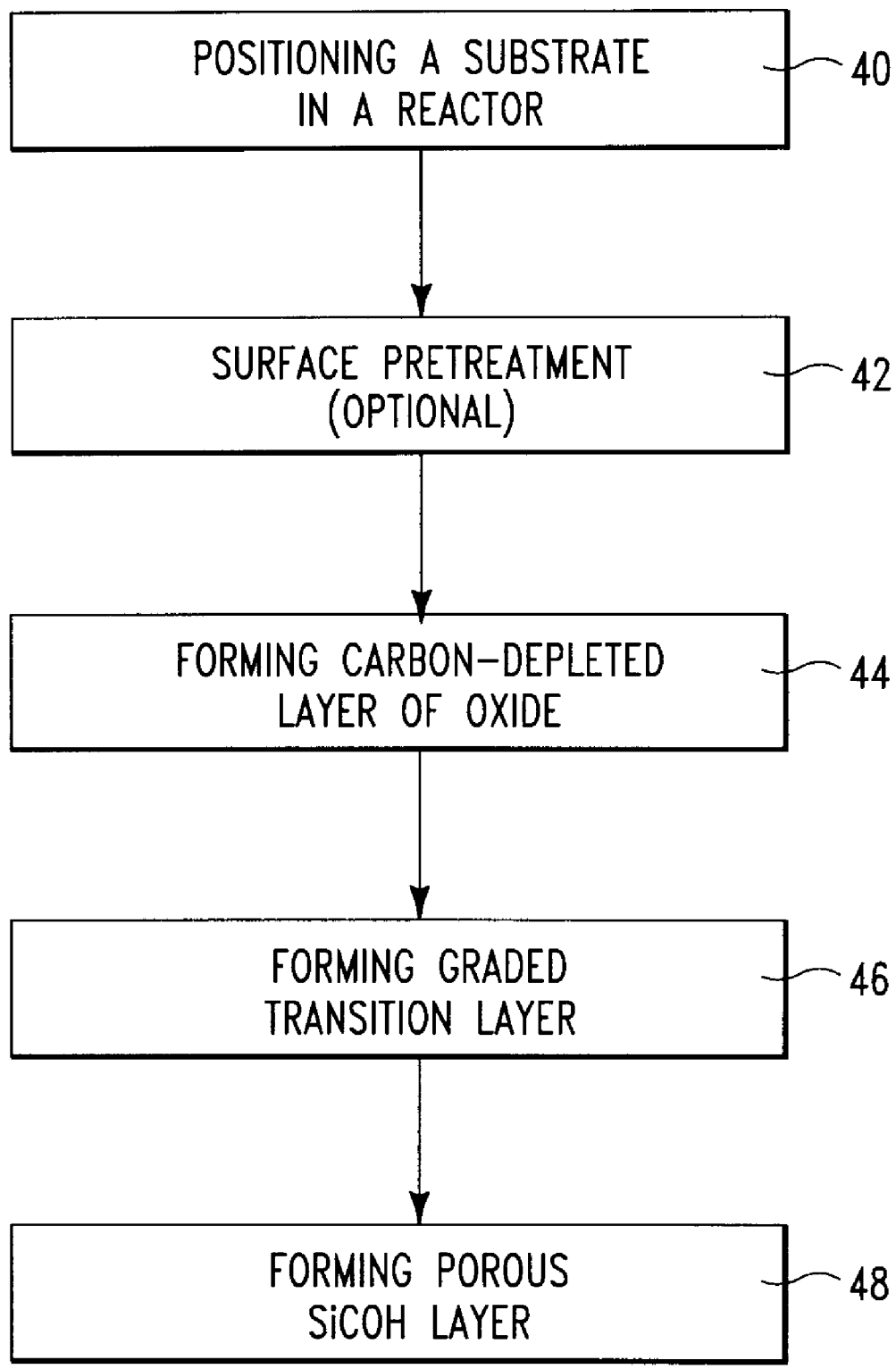
FIG. 8 is a block diagram illustrating the various steps of the process of forming a porous SiCOH layer according to the present invention.

Referring now to FIG. 8, the inventive method begins with the first step 40 of positioning a substrate such as an interconnect structure into a reactor chamber in which a plasma can be generated. Suitable reactors include: plasma enhanced chemical vapor deposition reactors, high-density plasma reactors, sputtering chambers, and ion beam chambers. The reactor is evacuated and then the substrate is heated to a temperature of about 400° C. or less. Preferably, the substrate is heated to a temperature of from about 200° C. to about 400° C.

In the next step 42, the substrate is subjected to an optional surface pretreatment step in which at least one surface pretreatment gas is flown into the reactor at which time it is converted into a plasma. The at least one surface pretreatment gas that can be used in the surface pretreatment step includes an inert gas such as Ar, Ne, He, Xe and Kr; $H_2$; $NH_3$; $O_2$; $SiH_4$ and $O_2$; and mixtures thereof. In some embodiments, F atoms may also be introduced into the feed gas. The flow rate of the surface pretreatment gas may vary depending on the reactor system and the type of gas being introduced. The chamber pressure can range anywhere from 0.05 to 20 torr, but the preferred range of pressure operation is 1 to 10 torr. The surface pretreatment step occurs for a first period of time, which is typically from about 0.08 to about 2 min.

An RF power source is typically used to generate a plasma of the surface pretreatment gas. The RF power source typically operates at 13.6 MHz, although other frequencies may be used. Optionally, a low frequency RF component (less than 1 MHz) may be used, or a combination thereof may be employed. The high frequency power density can range anywhere from 0.1 to 2.0 W/cm$^2$ but the preferred range of operation is 0.2 to 1.0 W/cm$^2$. The low frequency power density can range anywhere from 0.0 to 1.0 W/cm but the preferred range of operation is 0.0 to 0.5 W/cm$^2$.

At this point of the process, the next step 44 commences wherein a flow of precursor gases for the formation of the carbon depleted layer of oxide, such as that shown, for example, in FIG. 3 as oxide layer 28 are introduced into the reactor. The reactor at this point thus contains a plasma of the surface pretreatment gases still present and active within the reactor, yet the next layer's precursor gases of oxygen and SiCOH dielectric precursor are being introduced. The flows of the precursor gases into the reactor may vary and are dependent on the chemical and physical make-up of the layer that is being deposited. The flows of precursor reactants into the reactor occur for a second period of time, which is typically from about 1 to 4 seconds. During the transition of these process steps, it is preferred, although may not be absolutely critical, to maintain a constant chamber pressure by allowing the throttle valve position to adjust due to the change of process gas flows. It is also preferred, but again may not be absolutely critical, to maintain the same power levels during the transition of these process steps in order to provide a more reproducible layered film.

The next step 46 is forming a carbon graded transition layer on the carbon depleted layer such as that shown, for example, in FIG. 3 as graded transition layer 30. The interconnect substrate remains in the reactor chamber and step 46 is performed without interruption of the plasma in the reactor. The precursor gases of oxygen and SiCOH dielectric precursor are adjusted for the formation of this layer while the porogen precursor gas is introduced into the reactor chamber. This step 46 occurs for 2-4 seconds. During this step, the O2 flow is kept at a relatively high value, as shown in FIGS. 6 and 7, while the flows of the dielectric and porogen precursors are increased.

The last step 48 in the process of FIG. 8 is forming a porous SiCOH layer on the graded transition layer such as that shown, for example, in FIG. 2 as porous SiCOH layer 20. In the transitioning between step 46 and 48, the interconnect substrate is maintained in the plasma in the reactor chamber but the plasma parameters and precursor gases of oxygen, dielectric precursor and porogen precursor are adjusted to form the porous SiCOH layer. The length of time is variable depending upon the desired thickness of the porous SiCOH layer but should be about 50 seconds. The porous SiCOH has an ultralow dielectric constant (k<2.6) and the substrate is an interconnect structure having an upper layer of a dielectric material such as SiCHN on which the interfacial structure and then the SiCOH type dielectric are formed thereon.

The above processing steps of the present invention may be repeated any number of times to provide a multilayered structure in which each successively deposited layer has an interfacial layer therebetween.

Qualitatively, the interfacial strength provided by the transition layer of the present invention is strong enough to prevent delamination or cohesive failure near the interface between the interconnect dielectric and the dielectric cap layer during fabrication and reliability testing.

The dielectric precursor utilized may be any alkoxysilane. For example, this precursor may be selected from the group consisting of diethoxymethylsilane, dimethyldimethoxysilane, octamethylcyclotetrasiloxane, tetramethylcyclotetrasiloxane, with one preferred precursor being diethoxymethylsilane (DEMS). The porogen precursor may be selected from the group consisting of bicycloheptadiene (BCHD), hexadiene (HXD), or other molecules described in U.S. Pat. Nos. 6,147,009, 6,312,793, 6,441,491, 6,437,443, 6,441,491, 6,541,398, 6,479,110 B2, and 6,497,963, the disclosures of which are incorporated by reference herein. One preferred precursor is 2, 5-norbornadiene (or bicycloheptadiene BCHD).

EXAMPLES

Example 1

A Si wafer containing a layer of SiCNH alloy was used to simulate an interconnect substrate with the same SiCNH alloy capping a pre-formed patterned interconnect layer. A Si wafer containing a layer of SiCNH alloy was placed in a PECVD chamber and a porous SiCOH layer was prepared according to the flow rates of oxygen, dielectric precursor and porogen precursor illustrated in FIG. 5. Particulars of the process are described in the following Table 1.

TABLE 1

| Step Label in Figure | 0 to T1 | T1 to T2 | T3 |
|---|---|---|---|
| Duration (seconds) | 1 to 4 | 1 to 4 | 30 to 60 |
| RF Power, General Description | Low | High | High |
| Example RF Power (W) | 300-500 | 600-700 | 600-700 |
| Dielectric Precursor Flow | Low | Ramping Low to High | High |
| Porogen precursor Flow | Zero | Ramping to High | High |
| O2 Flow | High | Low | Low |

A TOF-SIMS analysis was done of the completed structure. The result is illustrated in FIG. 9.

Figure 9:
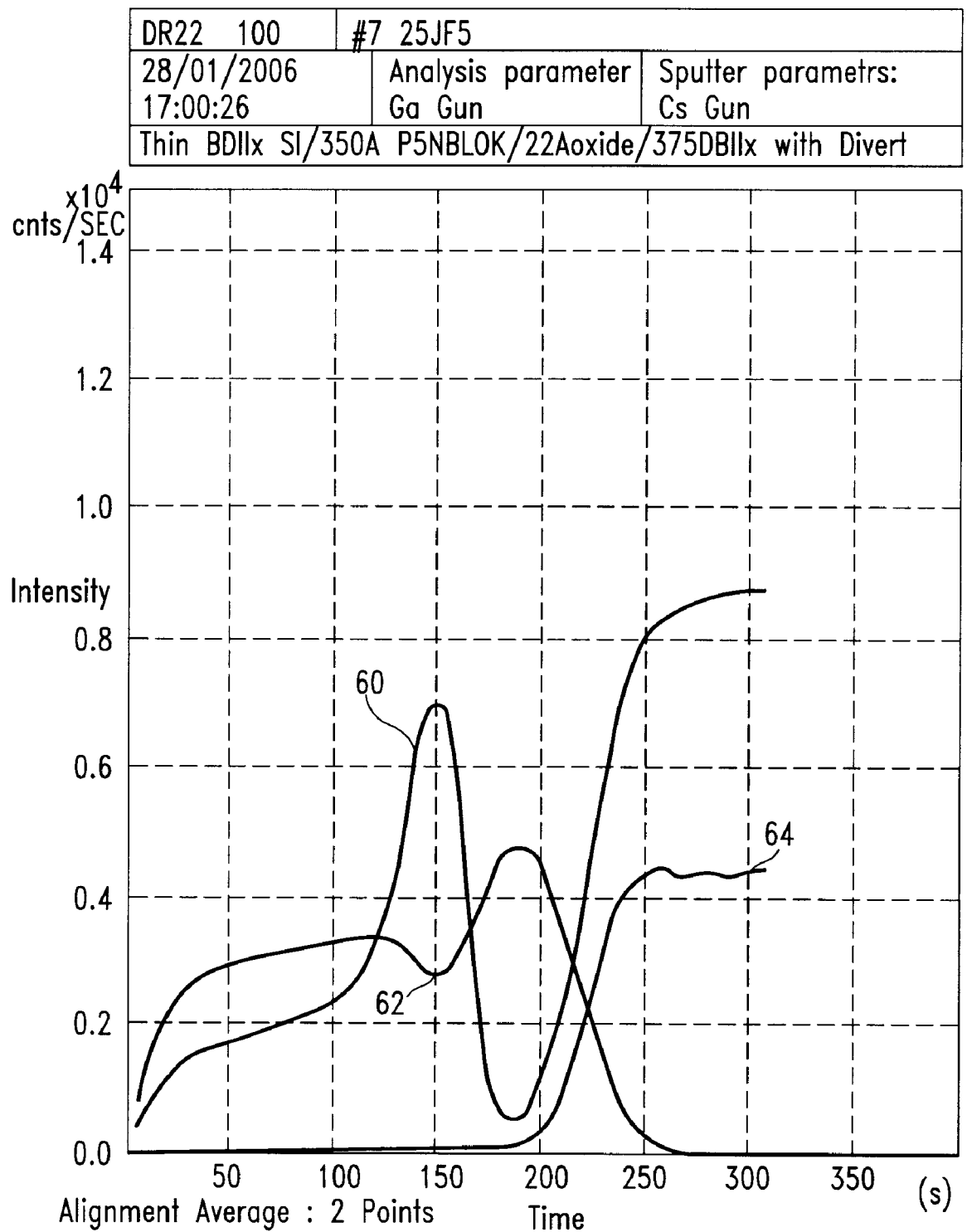
FIGS. 9 to 11 are TOF-SIMS analysis graphs for porous SiCOH formed according to the flow rates versus time shown in FIGS. 5 to 7, respectively.

The X axis of FIG. 9 is the sputter time, which is proportional to depth into the sample with zero of the X axis being the top surface of the sample and the time beyond 200 s being the SiCNH layer. The Y axis is signal intensity for the secondary ions detected by TOF-SIMS. The signal versus depth for carbon is labelled 60. The signal versus depth for SiO is labelled 62. The signal versus depth for SiN is labelled 64.

The sample illustrates a significant carbon peak and oxygen dip for this particular sample indicating a mechanically weak sample. The sample had a measured adhesive strength of 2.0 J/m².

Example 2

A second Si wafer containing a layer of SiCNH alloy (simulating an interconnect substrate) was placed in a PECVD chamber and a porous SiCOH formed according to the flow rate profiles of oxygen, DEMS dielectric precursor and BCHD porogen precursor as illustrated in FIG. 6. The particulars of the process are illustrated in Table 2 below.

TABLE 2

| Step Label in Figure | 0 to T1 | T1 to T2 | T2 to T3 | T4 |
|---|---|---|---|---|
| Duration (seconds) | 1 to 4 | 1 to 4 | 1 to 4 | 30 to 60 |
| RF Power, General Description | Low | High | High | High |
| Example RF Power (W) | 300-500 | 600-700 | 600-700 | 600-700 |
| Dielectric Precursor Flow | Low | Ramping Low to High | High | High |
| Porogen precursor Flow | Zero | Zero | Ramping to High | High |
| O2 Flow | High | Low | Low | Low |

It was found advantageous by the inventors to decrease the power density of the plasma such that steps 0 to T2 are performed with a reduced power density and steps after T2 are performed with a higher power density. It was found advantageous by the inventors that a SiCOH precursor ramp rate between 500 to 1500 milligrams per minute/second and a porogen precursor ramp rate between 100 to 600 milligrams per minute/second be used.

Figure 10:
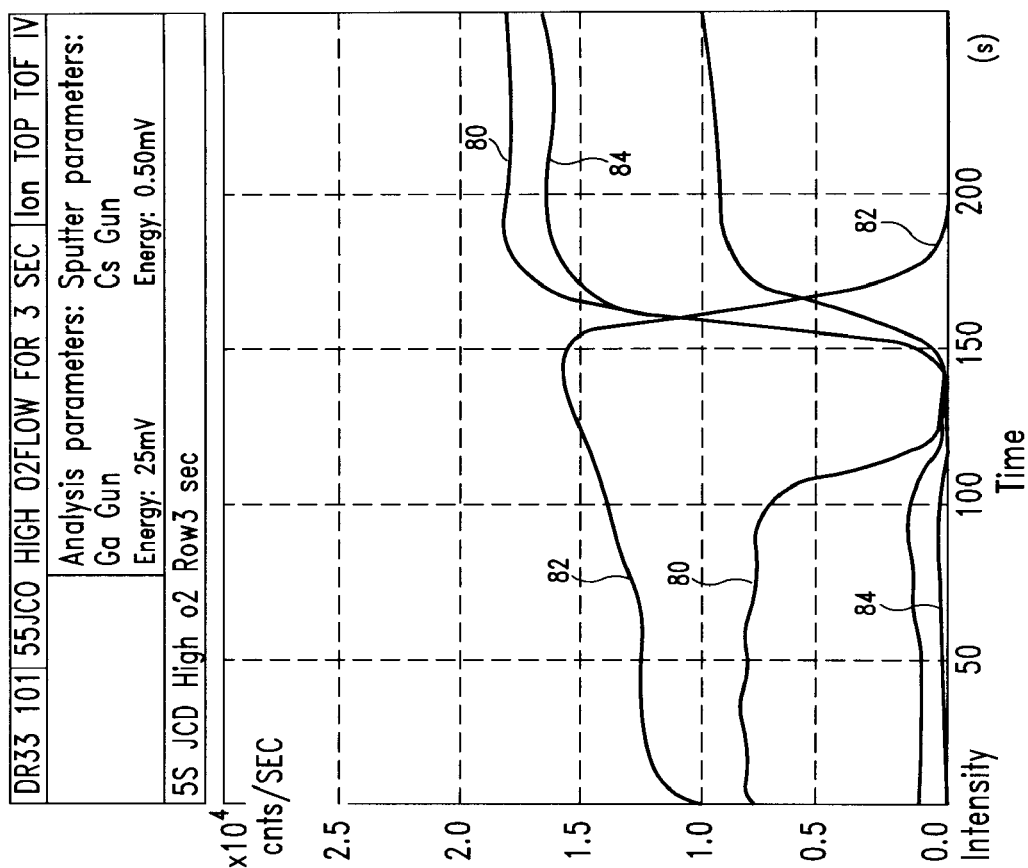

A TOFS-SIMS analysis for example 2 is illustrated in FIG. 10. The signal versus depth for carbon is labelled 70. The signal versus depth for SiO is labelled 72. The signal versus depth for SiN is labelled 74 As can be seen, the sample exhibits both a carbon peak and an oxygen dip indicating a mechanically deficient sample. This was verified by mechanical testing results which showed delamination in the area of the carbon peak and oxygen dip. The sample exhibited an adhesive strength of 2.5 J/m².

Example 3

A third interconnect substrate was prepared by placing the substrate in a PECVD chamber and flowing oxygen, DEMS dielectric precursor and BCHD porogen precursor according to the flow rate profile illustrate in FIG. 7. The particulars of the process are illustrated in Table 3 below.

TABLE 3

| Step Label in Figure | 0 to T1 | T1 to T2 | T2 to T3 | T4 |
|---|---|---|---|---|
| Duration (seconds) | 1 to 4 | 1 to 4 | 4 | 30 to 60 |
| RF Power, General Description | Low | High | High | High |
| Example RF Power (W) | 300-500 | 600-700 | 600-700 | 600-700 |
| Dielectric Precursor Flow | Low | Ramping Low to High | High | High |
| Porogen precursor Flow | Zero | Ramping to High | Ramping to High | High |
| O2 Flow | High | High | High | Low |

It was found advantageous by the inventors to decrease the power density of the plasma such that steps 0 to T2 are performed with a reduced power density and steps after T2 are performed with a higher power density. It was found advantageous by the inventors that a SiCOH precursor ramp rate between 500 to 1500 milligrams per minute/second and a porogen precursor ramp rate between 100 to 600 milligrams per minute/second be used.

Figure 11:
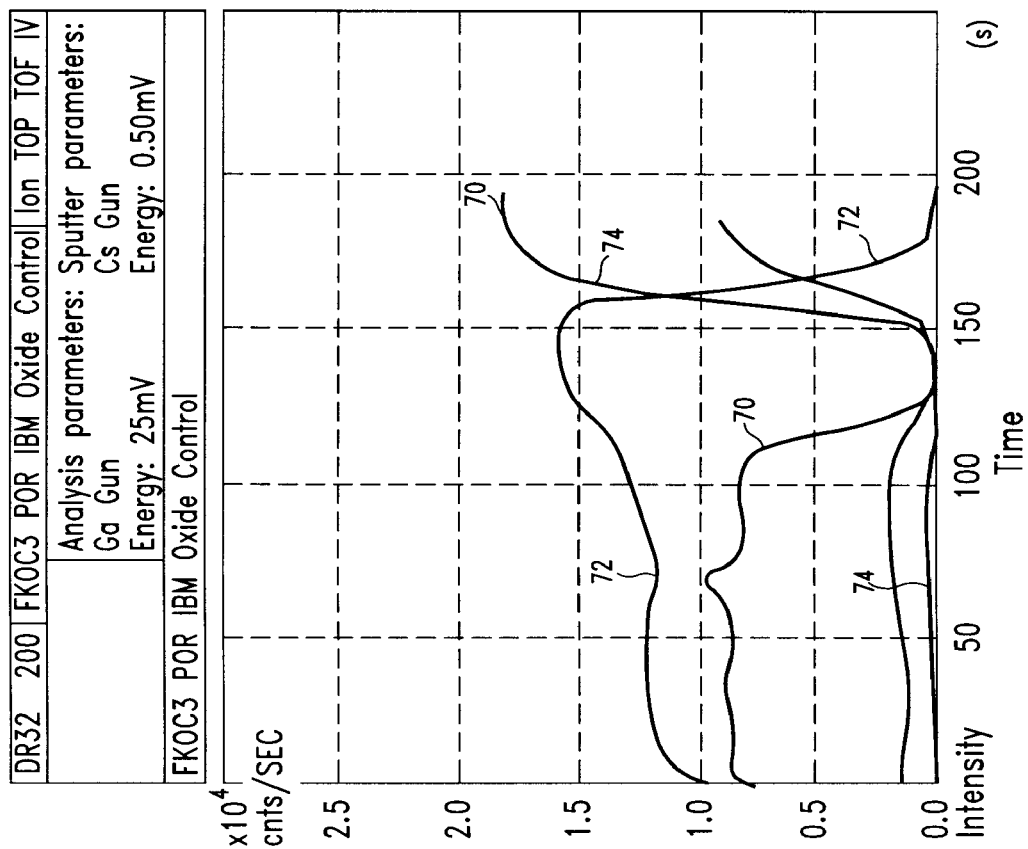

The TOFS-SIMS analysis for Example 3 is shown in FIG. 11. The signal versus depth for carbon is labelled 80. The signal versus depth for SiO is labelled 82. The signal versus depth for SiN is labelled 84. The signal versus depth for carbon, 80, shows a smooth carbon and the oxygen signal versus depth 82 has no distinct dip or valley. This profile indicates an interfacial structure without weak points, as would be the case if there were carbon peaks or oxygen dips as in Examples 1 and 2. Mechanical testing of Example 3 verified the robustness of the interfacial layer and strong adhesion of the porous SiCOH wherein the sample had a measured adhesive strength of 3.5-3.7 J/m². The increase in adhesive strength between Examples 1, 2 and Example 3 as well as the magnitude of the increase in adhesive strength was both surprising and unexpected.

It will be apparent to those skilled in the art having regard to this disclosure that other modifications of this invention beyond those embodiments specifically described here may be made without departing from the spirit of the invention.

Accordingly, such modifications are considered within the scope of the invention as limited solely by the appended claims.

What is claimed is:

1. A method for improving the interfacial strength between different layers, the method comprising the steps of:
   a) providing a substrate having a layer of dielectric or conductive material;
   b) introducing a flow of oxygen and SiCOH precursor into a chamber for a first time period so as to form a layer of oxide on the layer of dielectric or conductive material, the oxide layer having essentially no carbon;
   c) maintaining the flow of oxygen while gradually increasing the flow of the SiCOH precursor to a predetermined amount while also introducing and gradually increasing the flow of a porogen precursor to a predetermined amount into the chamber for a second time period so as to form a graded transition layer on the oxide layer, the graded transition layer having essentially no carbon at the interface with the oxide layer and gradually increasing carbon towards a porous SiCOH layer; and
   d) maintaining the flow of SiCOH precursor and porogen precursor at the predetermined amount in the chamber for a third time period while abruptly reducing the flow of oxygen to a predetermined value so as to form a porous SiCOH layer on the graded transition layer, the porous SiCOH layer having an homogenous composition throughout the layer.

2. The method of claim 1 wherein in the oxide layer, the concentration of carbon is less than 3 atomic percent.

3. The method of claim 1 wherein in the oxide layer, the concentration of carbon is less than 0.1 atomic percent.

4. The method of claim 1 wherein in the graded transition layer, there are no peaks in the carbon concentration.

5. The method of claim 1 wherein in the graded transition layer, there are no dips or valleys in the oxygen concentration.

6. The method of claim 1 wherein the steps of forming the layer of oxide, forming the graded transition layer and forming the porous SiCOH layer are performed by a plasma enhanced chemical vapor deposition process without interruption of the plasma between steps.

7. The method of claim 1 wherein the step b) of forming the layer of oxide is performed with the porogen flow to a divert line, and not to the substrate chamber.

8. The method of claim 1 wherein the step b) of forming the layer of oxide is performed with a reduced power density, and later steps are performed with a higher power density.

9. The method of claim 1 wherein the step c) includes gradually increasing the flow of the SiCOH precursor at a ramp rate between 500 to 1500 milligrams per minute/second while also gradually increasing the flow of a porogen precursor at a ramp rate between 100 to 600 milligrams per minute/second.

10. The method of claim 1 wherein all steps include using a He carrier gas flow in the range from 100 to 10,000 sccm, and step b) uses a SiCOH precursor flow in the range 100 to 1000 milligrams per minute, and step d) uses a SiCOH precursor flow in the range 500 to 5000 milligrams per minute and a porogen precursor flow in the range 500 to 5000 milligrams per minute.

11. A method for improving the interfacial strength between different layers, the method comprising the steps of:
   a) providing a substrate having a layer of dielectric or conductive material;
   b) introducing a flow of oxygen and a flow of SiCOH precursor into a chamber for a first time period so as to form a layer of oxide on the layer of dielectric or conductive material, the oxide layer having essentially no carbon, the flows of oxygen and SiCOH precursor being independently adjustable as to start time, end time and ramp rate during the first time period;
   c) maintaining the flow of oxygen while gradually increasing the flow of the SiCOH precursor to a predetermined amount while also introducing and gradually increasing the flow of a porogen precursor to a predetermined amount into the chamber for a second time period so as to form a graded transition layer on the oxide layer, the graded transition layer having essentially no carbon at the interface with the oxide layer and gradually increasing carbon towards a porous SiCOH layer, wherein the flows of oxygen, SiCOH precursor and porogen precursor being independently adjustable as to start time, end time and ramp rate during the second time period; and
   d) maintaining the flow of SiCOH precursor and porogen precursor at the predetermined amount in the chamber for a third time period while abruptly reducing the flow of oxygen to a predetermined value so as to form a porous SiCOH layer on the graded transition layer, the porous SiCOH layer having an homogeneous composition throughout the layer, wherein the flows of oxygen, SiCOH precursor and porogen precursor being independently adjustable as to start time, end time and ramp rate during the third time period.

12. The method of claim 11 wherein in the oxide layer, the concentration of carbon is less than 3 atomic percent.

13. The method of claim 11 wherein in the oxide layer, the concentration of carbon is less than 0.1 atomic percent.

14. The method of claim 11 wherein in the graded transition layer, there are no peaks in the carbon concentration.

15. The method of claim 11 wherein in the graded transition layer, there are no dips or valleys in the oxygen concentration.

16. The method of claim 11 wherein the steps of forming the layer of oxide, forming the graded transition layer and forming the porous SiCOH layer are performed by a plasma enhanced chemical vapor deposition process without interruption of the plasma between steps.

17. The method of claim 11 wherein the step c) is performed with a delay ("offset") time between increasing the SiCOH precursor flow and starting to increase the porogen precursor flow.

18. The method of claim 11 wherein the step b) of forming the layer of oxide is performed with the porogen flow to a divert line, and not to the substrate chamber.

19. The method of claim 11 wherein the step b) of forming the layer of oxide is performed with a reduced power density, and later steps are performed with a higher power density.

20. The method of claim 11 wherein the step c) includes gradually increasing the flow of the SiCOH precursor at a ramp rate between 500 to 1500 milligrams per minute/second while also gradually increasing the flow of a porogen precursor at a ramp rate between 100 to 600 milligrams per minute/second.

21. The method of claim 11 wherein all steps include using a He carrier gas flow in the range from 100 to 10,000 sccm, and step b) uses a SiCOH precursor flow in the range 100 to 1000 milligrams per minute, and step d) uses a SiCOH precursor flow in the range 500 to 5000 milligrams per minute and a porogen precursor flow in the range 500 to 5000 milligrams per minute.

* * * * *